(12) United States Patent
Wu et al.

(10) Patent No.: US 6,635,584 B2
(45) Date of Patent: Oct. 21, 2003

(54) VERSATILE SYSTEM FOR FORMING UNIFORM WAFER SURFACES

(75) Inventors: Zhiqiang Jeff Wu, Plano, TX (US); Mark S. Rodder, University Park, TX (US); Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/229,480

(22) Filed: Aug. 28, 2002

(65) Prior Publication Data

US 2003/0124807 A1 Jul. 3, 2003

Related U.S. Application Data

(60) Provisional application No. 60/344,461, filed on Dec. 28, 2001.

(51) Int. Cl.$^7$ .......................... H01L 21/31; H01L 21/469
(52) U.S. Cl. .................. 438/775; 438/663; 438/770
(58) Field of Search ................. 438/263, 264, 438/488, 475, 495, 501, 502, 505, 506, 509, 510, 513, 514, 528, 529, 663, 723, 724, 738, 743, 744, 756, 757, 758, 766, 770, 775, 914, 954

(56) References Cited

U.S. PATENT DOCUMENTS

| | | | |
|---|---|---|---|
| 5,316,981 A | * | 5/1994 | Gardner et al. .............. 438/663 |
| 5,498,577 A | * | 3/1996 | Fulford, Jr. et al. ........ 438/663 |
| 6,319,775 B1 | * | 11/2001 | Halliyal et al. ............. 438/261 |

* cited by examiner

*Primary Examiner*—David Nhu
(74) *Attorney, Agent, or Firm*—Wade James Brady, III; Frederick J. Telecky, Jr.

(57) ABSTRACT

A system for fabricating an integrated circuit is disclosed that includes providing a semiconductor substrate (10), and forming a gate oxide layer (12) on an active area on the substrate. A polysilicon gate (14) is formed, on top of the gate oxide, by etching. Etch damage (16) on the substrate surface is repaired by anneal in an inert gas environment— e.g., He, Ne, $N_2$, Ar gas, or combinations thereof.

20 Claims, 1 Drawing Sheet

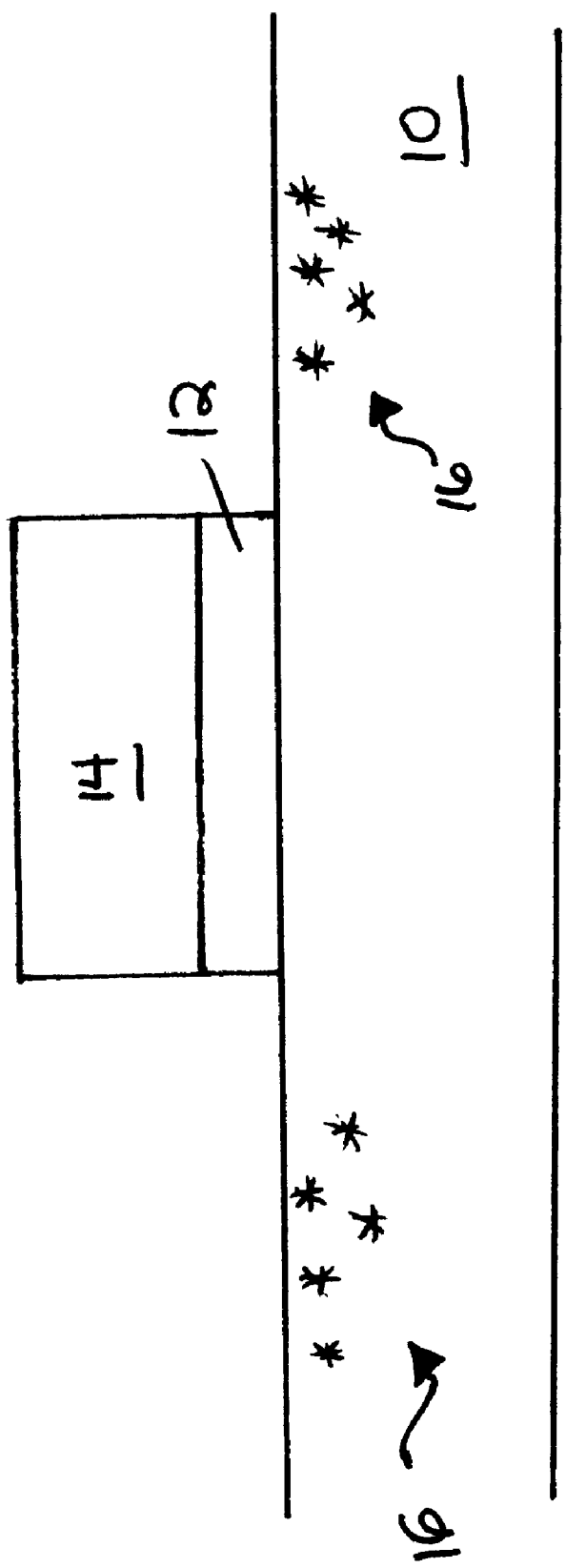

VERSATILE SYSTEM FOR FORMING UNIFORM WAFER SURFACES

This application claims priority from Provisional Application Serial No.: 60/344,461, filed on Dec. 28, 2001.

TECHNICAL FIELD OF THE INVENTION

The present invention relates in general to the field of integrated circuits, and more particularly, to improving across-wafer uniformity of transistor characteristics by reduction of silicon damage caused by gate etch.

BACKGROUND OF THE INVENTION

Without limiting the scope of the invention, its background is described in connection with the fabrication of Complementary Metal Oxide Semiconductor ("CMOS") devices, as an example. In particular, the background is described in connection with a process for fabricating CMOS devices. In the process of manufacturing CMOS devices, numerous masking and etching steps are required to fabricate the electronic devices on the chip substrate following polysilicon re-oxidation and source/drain implantation.

As is well known in the art of integrated circuit design, layout and fabrication, the manufacturing cost of a given integrated circuit is dependent largely upon the chip area required to implement desired functions. Chip area is defined by the geometries and sizes of the active components disposed in the wafer substrate. Active components include gate electrodes in metal-oxide semiconductors (MOS) and diffused regions such as MOS source and drain regions and bipolar emitters, collectors and base regions.

Present integrated circuit fabrication methodologies require the use of source/drain extensions formed by implantation and diffusion steps, which link source/drain contacts to a channel of a device. Behavioral properties of source/drain extensions are sensitive to factors such as: the amount of oxide on top of the silicon surface, and the amount of damage in the silicon after a polysilicon re-oxidation step. The amount of oxide grown on silicon during a polysilicon re-oxidation step is very sensitive to the amount of damage present. Hence, the source/drain extension properties are very susceptible to variations due to the varying amount of damage in silicon. Therefore, there is a need for increased uniformity of the substrate surface following the formation of features (e.g., gates) that require deep etching steps (e.g., down to the substrate surface). Reduced substrate non-uniformity prior to further processing is also needed, resulting in transistors with both high reliability and high performance without the high cost associated with increased steps or new machinery.

What is needed is a system for producing devices having increased substrate uniformity after gate formation and etch steps—creating uniform, consistent substrate surfaces for further processing. The system should comprehend the use of existing process equipment, processes and workflows. Finally, a need has arisen for a simplified process for producing more uniform substrate surfaces that is economical using existing techniques and materials.

SUMMARY OF THE INVENTION

The present invention recognizes that etch damage to semiconductor device structures—such as substrates or other semiconductor features, whether formed, deposited, or etched—causes downstream failure during device processing. The present invention provides a system for fabricating an integrated circuit that provides a semiconductor substrate and forms a gate oxide layer on an active area on the substrate. Next, a polysilicon gate is formed on top of the gate oxide, and etch damage is substantially repaired on the substrate surface. An inert gas repair anneal step is performed prior to subsequent polysilicon processing (e.g., polysilicon re-oxidation). The inert gas repair anneal may be used to decrease non-uniformity caused by exposure to plasma, or by deposition steps (e.g., deposition of polysilicon). It may also be used to decrease the non-uniformity of source/drain implantation of LDD or HDD, which are highly susceptible to scatter in a damaged substrate.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1 is a cross section of an integrated circuit gate over a damaged substrate.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention and are not to limit the scope of the invention.

Although the present invention is described, for illustrative purposes, in conjunction with a digital signal processor (DSP), the teachings and principles disclosed are applicable in a number of applications to a number of other devices. The present invention may be utilized in other types of non-memory, mixed DSP-memory, memory, or other circuits.

One conventional method of fabricating CMOS devices includes a number of process steps beginning with, e.g., an epitaxial deposition of a p-layer within a silicon substrate, followed by n-well pattern/implant and a p-well pattern/implant. Next, a field oxide is grown using a conventional LOCOS (Local Oxidation of Silicon) process, or deposition. An NMOS pattern is then implanted including, e.g., a $V_t$ (Voltage threshold) adjust implant, and an anti-punch-through implant. The next step is generally a PMOS patterning, which may include a $V_t$ adjust implant and an anti-punch-through implant. Next, a gate oxide is grown followed by a polysilicon gate pattern/etch. The n- and p- lightly doped drains (LDDs) are patterned and implanted, followed by the n- S/D ("source/drain") pattern/implant and the p- S/D pattern/implant. Summarizing, the process may generally include the following steps:

an epitaxial deposition of a p-layer with a silicon substrate;
n-well Pattern/Implant*;
p-well Pattern/Implant*;
LOCOS field Oxide*;
NMOS Pattern*;
$V_t$ adjust implant;

Anti-punch-through implant;
PMOS pattern*;
$V_t$ adjust implant;
Anti-punch-through implant;
Gate oxide growth;
Poly gate Pattern/Etch*;
n- Lightly Doped Drains ("LDD") pattern/implant*;
p- Lightly Doped Drains ("LDD") pattern/implant*;
n- S/D ("source/drain") pattern/implant*; and
p- S/D pattern/implant*.
(* designates masking level or step)

As it should be apparent, the above process flow requires a number of masking levels to produce a device. Each masking level and processing step increases the costs of production—both in terms of the individual process steps and also in terms of yield loss due to process errors—as well as increasing processing time and the complexity of the process. Damage to the substrate surface during etching, implantation and oxidation steps is also increased.

The process of the present invention provides a CMOS process that reduces wafer surface non-uniformity caused by gate formation. In one embodiment, the invention comprises process steps for the production of a MOS transistor device including: (1) providing a semiconductor substrate; (2) forming a gate oxide layer on an active area on the upper surface portion of the substrate; (3) forming a polysilicon gate layer on top of the gate oxide; and (4) a damage repair anneal in an inert environment at or greater than 800 degrees Celsius for between about 20 to 60 minutes, prior to further processing steps (e.g., oxidation processes).

Formation of polysilicon gates typically include an etch step that damages the surface of the substrate. The present invention repairs that damage prior to further processing steps, thereby reducing non-uniformity across the wafer surface. In particular, the inert gas anneal repairs etch damage to the substrate. Damaged substrate has a higher rate of oxidation than that of un-damaged silicon, which is the source of the non-uniformity. The present invention reduces silicon damage so that oxidation rate variability is reduced for subsequent oxidation steps.

In fact, the present invention provides a combination of the damage anneal and oxidation steps, resulting in improved uniformity in oxide thickness. A variation of the process step is to replace the inert furnace anneal step with a rapid thermal anneal (RTA) for 20–30 seconds. Alternatively, a dilute mixture of oxygen may be included at the beginning of the damage anneal, such that the oxygen fraction is increased gradually to complete the polysilicon re-oxidation. Inert gas for use with the present invention may be, e.g., He, Ne, Ar, $N_2$, or combinations thereof.

The following description of an embodiment of the present invention is related to FIG. 1. A substrate 10 is provided, and a gate dielectric 12 is formed on substrate 10. The substrate 10 is preferably p-type in conductivity, but n-type substrates can also be used. Gate dielectric 12 may be an oxide that is deposited or thermally grown—e.g., $SiO_2$, a nitride, an oxynitride, or any combination thereof—and is generally on the order of 1 to 10 nm thick. A layer of silicon-containing material, which may be patterned and etched to form gate structure 14, is formed on gate dielectric 12. The gate structure 14 on the gate dielectric 12 may also have sidewalls (not depicted). After etching the gate structure 14, etch damage 16 is left on the wafer surface about the gate structure 14.

Substrate 10 may be made of silicon, gallium arsenide, silicon on insulator (SOI) structures, epitaxial formations, germanium, silicon germanium, polysilicon, amorphous silicon, and/or like substrates, semi-conductive or conductive. The substrate 10 is typically made of single crystal silicon, and is usually lightly doped with boron, phosphorous or arsenic atoms.

The silicon-containing material of the gate structure 14 may be, for example, polycrystalline silicon ("poly" or "polysilicon"), or it may be epitaxial silicon or any other semiconducting material. The substrate may also include isolation structures between the regions forming the different gate structures 14. These isolation structures may comprise an oxide or some other insulator. The purpose of the isolation structure is to isolate the active devices from one another on the substrate. Once formed, the substrate may contain wells that may be of the opposite conductivity type when compared to the conductivity of the substrate.

Following the formation of the integrated circuit gate 14 on the substrate 10, the entire substrate 10, e.g., a silicon wafer, is exposed to an inert gas atmosphere anneal that repairs the damage to the substrate caused by etch chemicals. Damaged silicon oxidizes faster than undamaged silicon. The repair anneal prior to the polysilicon re-oxidation step prevents the formation uneven or non-uniform surface thickness, because repaired silicon provides more consistent results in, e.g., heavily doped drain (HDD) implantation. The present invention increases device yield during source/drain implantation steps because the HDD implant profile is very sensitive to screening oxide thickness. Substrate damage causes HDD implantation scatter, which is reduced using the present invention.

While this invention has been described with reference to illustrative embodiments, it is not intended that this description be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method of fabricating an integrated circuit comprising the steps of:
    providing a semiconductor substrate having an active area and a surface containing said active area;
    forming a gate insulator layer on said active area on said substrate; forming a polysilicon gate layer over said gate insulator by forming a layer of polysilicon over said gate insulator layer;
    patterning a polysilicon gate region over said gate layer;
    etching said gate layer and said insulator layer to said substrate surface to form said polysilicon gate region and create etch damage at and beneath the exposed substrate surface; and
    then repairing said etch damage by a repair anneal in an inert environment.

2. The method of claim 1, wherein the gate oxide comprises a material selected from the group consisting of silicon dioxide, silicon oxynitride and silicon nitride.

3. The method of claim 1, wherein the polysilicon gate layer comprises a material selected from the group consisting of doped polysilicon, undoped polysilicon, epitaxial silicon, and any combination thereof.

4. The method of claim 1, wherein the repair anneal comprise He, Ne, $N_2$, Ar gas and combinations thereof.

5. The method of claim 1, wherein the repair anneal is at a temperature about 800 degrees Celsius.

6. The method of claim 1, wherein the repair anneal is at a temperature about 800 degrees Celsius for from about 20 to about 60 minutes.

7. The method of claim 1, wherein the repair anneal is at a temperature at least about 800 degrees Celsius for from about 20 to about 60 minutes.

8. The method of claim 1, wherein the repair anneal includes an increase in the amount of ambient oxygen during the anneal step.

9. A method of fabricating a semiconductor device comprising the steps of:

provide a semiconductor substrate having an active area and a surface containing said active area;

forming a gate insulator layer on said active area on said substrate;

providing and patterning a polysilicon gate layer over said gate insulator layer and etching said gate layer and said insulator layer to said substrate to create etch damage at and beneath the exposed substrate surface; and then repairing etch damage on the substrate surface by a repair anneal in an inert environment.

10. The method of claim 9, wherein the gate oxide comprises a material selected from the group consisting of: silicon dioxide, silicon oxynitride and silicon nitride.

11. The method of claim 9, wherein the polysilicon gate layer comprises a material selected from the group consisting of: doped polysilicon, undoped polysilicon, epitaxial silicon, and any combination thereof.

12. The method of claim 9, wherein the repair anneal comprise He, Ne, $N_2$, or Ar gas and combinations thereof.

13. The method of claim 9, wherein the repair anneal is at a temperature about 800 degrees Celsius.

14. The method of claim 9, wherein the repair anneal is at a temperature about 800 degrees Celsius for from about 20 to about 60 minutes.

15. The method of claim 9, wherein the repair anneal is at a temperature at least about 800 degrees Celsius for from about 20 to about 60 minutes.

16. The method of claim 9, wherein the repair anneal comprises a progressive increase in the amount of ambient oxygen during the anneal step.

17. A method of producing a uniform surface during the fabrication of an integrated circuit, comprising the steps of:

providing a semiconductor substrate having an active area and a surface containing said active area;

forming a gate insulator layer on said active area on an upper surface portion of the substrate;

forming a polysilicon gate layer over said gate insulator layer by forming a layer of polysilicon over said gate insulator layer, patterning a gate region over said gate layer and etching said gate layer and said insulator layer to said substrate surface to form said polysilicon gate region and create etch damage at and beneath the exposed substrate surface; and than repairing etch damage on the upper surface portion by a repair anneal in an inert environment while injecting increasing amounts of oxygen during the repair anneal.

18. The method of claim 17, wherein the repair anneal comprise He, Ne, $N_2$, or Ar gas and combinations thereof.

19. The method of claim 17, wherein the repair anneal is at a temperature about 800 degrees Celsius.

20. The method of claim 17, wherein the repair anneal is at a temperature at least about 800 degrees Celsius for from about 20 to about 60 minutes.

* * * * *